US005220296A

United States Patent [19]

von Flotow et al.

[11] Patent Number: 5,220,296

[45] Date of Patent: Jun. 15, 1993

[54] COUPLER FOR ELECTRICAL WAVEGUIDES AND MECHANICAL WAVEGUIDES

[75] Inventors: Andreas von Flotow, Somerville; Nesbitt Hagood, Wellesley, both of Mass.; Tomas Valis, Downsview, Ontario, Canada

[73] Assignee: Massachusetts Institute of Technology, Cambridge, Mass.

[21] Appl. No.: 786,538

[22] Filed: Nov. 1, 1991

[51] Int. Cl.[5] .................................. H03H 5/00

[52] U.S. Cl. .................................. 333/24 R; 333/157; 310/323

[58] Field of Search .................. 333/24 R, 157, 195, 333/159, 150, 141, 24.1, 24.2, 24.3, 25, 26; 310/323, 328, 334

[56] References Cited

U.S. PATENT DOCUMENTS

| | | | |
|---|---|---|---|
| 3,710,283 | 1/1973 | Alphonse | 333/141 R |
| 4,562,374 | 12/1985 | Sashida | 310/323 X |
| 4,672,256 | 6/1987 | Okuno et al. | 310/323 |
| 4,692,652 | 9/1987 | Seki et al. | 310/323 |
| 4,742,260 | 5/1988 | Shimizu et al. | 310/323 |
| 4,810,923 | 3/1989 | Tsukimoto et al. | 310/323 |
| 4,882,500 | 11/1989 | Iijima | 310/323 |

OTHER PUBLICATIONS

"A Travelling Wave Ultrasonic Transducer" in proc. 1982 Ultrasonics Symposium, pp. 498–501, San Diego Oct. 27–29, 1982.

"Damping of Structural Vibrations with Piezoelectric Materials" J. Sound and Vibration, vol. 146, No. 2, pp. 243–268, 1991.

"Ultrasonic Linear Motors Using a Multilayered Piezoelectric Actuator" Ferroelectrics, vol. 87, pp. 331–334, 1988.

*Primary Examiner*—Robert J. Pascal

*Assistant Examiner*—Ali Neyzari

*Attorney, Agent, or Firm*—Wolf, Greenfield & Sacks

[57] ABSTRACT

A system for coupling energy between electrical and mechanical waves includes a mechanical waveguide for propagating a mechanical wave having a mechanical wavelength at a given frequency, and an electromechanical energy converter for coupling energy between electrical and mechanical waves attached to a portion of the waveguide and capable of propagating an electrical wave having an electrical wavelength substantially equal to the mechanical wavelength at the given frequency. The portion has a length, measured in units of coupled wavelength, which is selected on the basis of the reciprocal of the coupling strength of the electromechanical converter and a selected amount of wave energy to be coupled. The function is based primarily on desired efficiency and may also be an odd integer multiple of the coupling strength reciprocal, preferably one. Piezoelectric elements are the preferred electromechanical energy conversion elements. This system is applicable to damping of structural waves, transferring structural waves from one mechanical waveguide- to another, and for creating a linear motor.

24 Claims, 2 Drawing Sheets

COUPLER FOR ELECTRICAL WAVEGUIDES AND MECHANICAL WAVEGUIDES

FIELD OF THE INVENTION

The present invention relates to systems for converting energy between mechanical waves and electrical waves. More particularly, the invention relates to systems for coupling wave energy between mechanical and electrical waveguides and to applications of coupling systems for damping, isolating, and creating resonance of mechanical waves.

BACKGROUND OF THE INVENTION

Systems for coupling wave energy are commonly available for optical and microwave waveguides. Such systems couple energy of a wave of one type propagating in one waveguide into wave energy of the same type propagating in a second waveguide. The present work relates to such coupling between electrical and mechanical waves in electrical and mechanical waveguides. The closest similar work known to the Applicants is that of Baer and Kino ("A Travelling Wave Ultrasonic Transducer," in *Proc.* 1982 *Ultrasonics Symposium,* pp. 498-501, San Diego, Oct. 27-29, 1982) who considered coupling an electrical delay line to a piezoelectric stack to generate longitudinal waves in the stack, thus creating an ultrasonic transducer. Coupling into and from a mechanical waveguide was not performed. Hagood and von Flotow ("Damping Of Structural Vibrations With Piezoelectric Materials And Passive Electrical Networks," *J. Sound And Vibration,* Vol. 146, No. 2, pp. 243-268, 1991) considered tuned L-R-C coupling to vibrating structures.

Known components which are capable of converting mechanical energy to electrical energy include piezoelectric, electrostrictive, magnetostrictive and electromagnetic devices. Such components have been used, for example, for vibration damping, sensing, motors, and transducers. Such systems have not been used for coupling wave energy between electrical and mechanical waves.

Accordingly, it is an object of the present invention to provide a system for coupling energy between electrical and mechanical waves.

SUMMARY OF THE INVENTION

To accomplish the foregoing and other objects, there is provided a system for coupling energy between electrical and mechanical waves. The system includes a mechanical waveguide for propagating a mechanical wave having a mechanical wavelength at a given frequency and an electromechanical energy converter, for coupling energy between electrical and mechanical waves. The electromechanical energy converter, or waveguide coupler, which has a specific coupling strength with the waveguide is attached to a portion of the mechanical waveguide, and is capable of propagating an electrical wave having an electrical wavelength substantially equal to the mechanical wavelength at the given frequency. The coupled portion of the waveguide has a length, measured in units of the coupled wavelength, which is selected on the basis of the reciprocal of the coupling strength and a selected amount of energy to be coupled. This coupling length is preferably substantially equal to an odd integer multiple (preferably one) of the reciprocal of the coupling strength of the electromechanical converter. Normally, this length is greater than several wavelengths.

In a preferred embodiment of the present invention, the electromechanical converter includes piezoelectric elements distributed over the coupling portion of the mechanical waveguide. The number of piezoelectric elements used is preferably greater than two per coupled wavelength. In a particular embodiment, the mechanical waveguide is an aluminum beam and the electrical wave is propagated by an L-C ladder circuit.

Another embodiment of the present invention includes an electrical impedance which dissipates electrical energy obtained by coupling the energy of a mechanical wave. This embodiment is particularly useful for damping mechanical waves in a structure.

In another embodiment of the present invention, the energy received in an electrical waveguide is converted back into mechanical energy in a second waveguide. Such an embodiment is useful, for example, for isolating mechanical structures from waves propagating in other surrounding structures.

In yet another embodiment of the present invention, the electrical energy converted from mechanical energy at one end of the mechanical waveguide, e.g. a beam, is coupled back into the opposite end of the same waveguide, thus forming a loop. When the loop through which the electrical and mechanical waves flow has a length equal to an integer multiple of the wavelength, resonance may be obtained. This structure is useful, for example, for creating a linear motor when the mechanical wave in the beam is a bending wave.

DETAILED DESCRIPTION

In the following detailed description of illustrative embodiments of the present invention, similar reference numbers are utilized to indicate similar structures. It should be understood that the embodiments shown in these figures are merely examples of the present invention shown for illustrative purposes and that numerous modifications to these examples should be apparent to those of ordinary skill in the art from the detailed description below.

Figure 1:
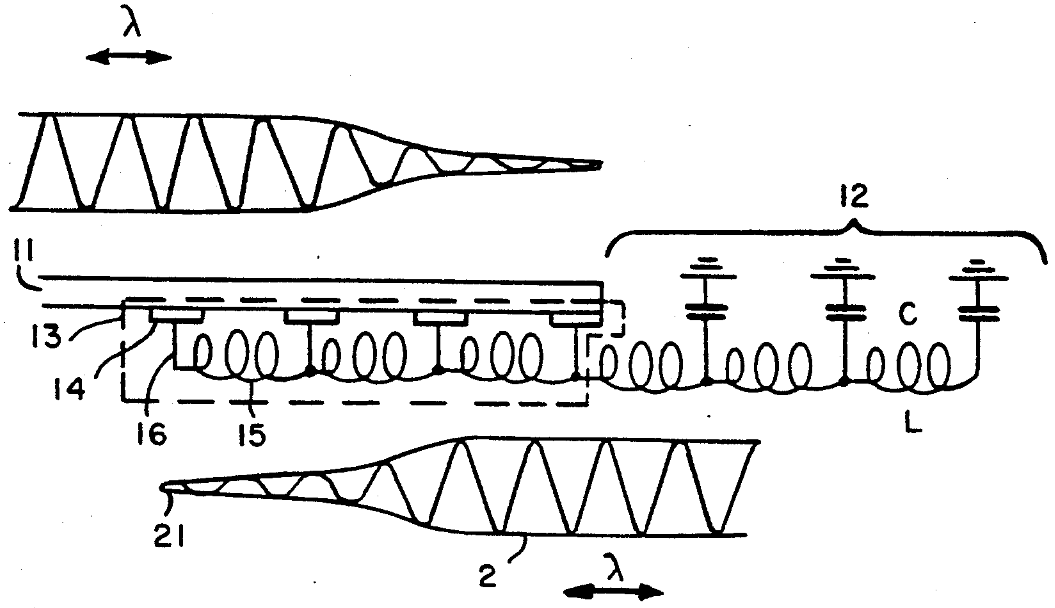
FIG. 1 is a schematic diagram of a coupler in accordance with the present invention, coupling electrical and mechanical waveguides.

Referring now to FIG. 1, a mechanical waveguide 11 is coupled to an electrical waveguide 12 via an energy converter or waveguide coupler 13. Although the mechanical waveguide 11 as shown in FIG. 1 is a solid beam, the invention may also be applicable to other mechanical waveguides in which kinetic and potential wave energy may be propagated, including both fluid and solid, discrete and continuous systems. The electrical waveguide 12 shown in FIG. 1 is an L-C ladder circuit including inductors L and capacitors C. Other types of electrical waveguides may also be used to receive an electrical wave propagated in the coupler 13 in response to a wave in the mechanical waveguide 12. The coupler 13 may also receive an electrical wave, from either an electrical wave generator, for instance, or electrical waveguide 12, for coupling it to the mechanical waveguide 11. Other electrical circuits which receive or provide an electrical wave may also be used in place of an electrical waveguide 12 provided that the electrical and mechanical wave speeds remain matched.

Coupler 13 includes electromechanical energy conversion elements. A variety of such elements are well known, and include piezoelectric, electrostrictive, magnetostrictive, and electromagnetic elements. These elements have both mechanical and electrical properties which provide a coupling strength with a waveguide which represents the ratio of the input energy of one type of wave to the output energy of a second type of wave. That is, the coupling strength of the elements in response to a mechanical wave represents how much mechanical energy of the wave is transferred by the elements and how much of the transferred energy is converted to electrical energy by the elements. Conversely, the coupling strength of the elements in response to an electrical wave represents how much electrical energy of the wave is transferred by the elements and how much of the transferred energy is converted to mechanical energy by the elements. The amount of wave energy transferred by the elements depends on how well the elements are coupled to receive the wave and is known as the efficiency factor. The amount of transferred energy which is converted by the elements is a known constant for given elements and is known as the coupling coefficient. For example, the electromechanical energy conversion ratio for piezoceramics may be obtained from suppliers or from the IEEE Standard 176—1978 on Piezoelectricity. In general, the coupling strength is the product of the coupling coefficient and the efficiency factor. Given the coupling strength of the electromechanical elements used in coupler 13, an optimal coupling length (the portion of the mechanical waveguide to which the coupler 13 is connected) may be determined. This determination will be described in more detail below.

The construction of the mechanical waveguide 11, electrical waveguide 12 and coupler 13, in accordance with the present invention, is dependent on at least the desired operating conditions of the waveguides. That is, both waveguides and the coupler are tuned to propagate a signal having substantially the same wavelength at a given frequency. The mechanical properties of the mechanical waveguide 11 and coupler 13, particularly stiffness and mass, and the electrical properties of the electrical waveguide 12 (if used) and coupler 13, particularly inductance and capacitance, are selected so that the wavelength of a wave propagated in the mechanical waveguide at a selected frequency is substantially equal to the wavelength of a wave propagated in the electrical waveguide at the selected frequency. In many applications, the mechanical structure and the frequency of the mechanical wave are both predetermined. In such cases, the inductance and capacitance of the coupler 13 and the electrical waveguide 11 are adjusted to obtain matching of the wavelength and frequency of the electrical and mechanical waves. In other applications, the frequency may be adjustable which provides more degrees of freedom for tuning of the waveguides (11, 12) and the coupler 13.

Given the operating conditions, including the desired wavelength and frequency of the wave to be coupled, an optimal coupling length (as mentioned above) may be determined. This length is the distance between the distant edges of the electromechanical energy conversion elements of the coupler 13. The optimal coupling length, measured in units of the wavelength of the coupled wave, is substantially equal to an odd integer multiple (preferably one) of the reciprocal of the coupling strength. The most efficient coupling may be obtained when the coupling length is exactly equal to the reciprocal of the coupling strength. At optimal coupling, all of the signal of one type of wave is converted to the other type of wave. Efficiency may be reduced according to the following cosinusoidal function of the deviation from the optimal coupling length, assuming matched phase speeds:

$$\tfrac{1}{2}(\cos(\text{deviation}\,\pi/\text{optimal length})+1) \quad (1)$$

Efficiency is reduced because the wave is either incompletely coupled, possibly resulting in reflections of the wave, or over-coupled, resulting in the conversion of the propagating wave back into the original type of wave in the waveguide of origin. Both types of non-optimal coupling result in the formation of a standing wave in the original waveguide if the waveguide has an end off which reflections occur. Deviations from the optimal coupling length may also result from deviations in the operating conditions and in the materials used in the waveguides or coupler. Such deviations may make exact tuning difficult to obtain; however, substantial efficiency may still be obtained. For most applications, an efficiency of 90% or better is preferable. In general, the selection of the coupling length should be based on the optimal coupling length. It should be understood that a fraction of the optimal coupling length may be used if only a part of a wave is to be coupled. This fraction may be determined according to the error function (1) above.

The coupling used in the system of the present invention is weak, because only a small fraction of a wave is coupled per wavelength. As illustrated in FIG. 1 (though not to scale), the amount of wave transferred between waveguides gradually increases from one end of the coupler (21) to the other end (22). Assuming that the coupler 13 has the optimal coupling length, all of the wave is transferred by the end of the coupler. If the coupler 13 were longer, a wave propagating in the coupler would begin to be converted back into the other type of wave. Weak coupling results in reduced reflections due to sudden change in the characteristics of the waveguide.

The embodiment shown in FIG. 1 is a particular application of the present invention for coupling of bending waves in a continuous mechanical waveguide to an electrical wave in a discrete electrical waveguide. The electromechanical elements are piezoelectric elements 14, which are oriented to respond more strongly to bending waves than to other types of waves. The manner of orientation of these elements to obtain efficient coupling of an arbitrary wave is known to those of ordinary skill in the art. As mentioned above, other types of electromechanical elements may also be used. The maximum spacing of multiple piezoelectric elements 14, in this embodiment, though not shown to scale in FIG. 1, depends on the Nyquist criterion. That is, more than two piezoelectric elements per wavelength are required, because these elements may be considered as samplers of the mechanical wave. Several elements per wavelength are preferable because the sampling resolution is increased. Also, coherent scattering may occur when the number of elements per wavelength is an integer, resulting in the generation of a standing wave. This problem may be reduced by providing a non-integer number of elements per wavelength.

In the embodiment shown in FIG. 1, adjacent piezoelectric elements 14 are interconnected via inductors 15 in a manner similar to the construction of the LC ladder of the electrical waveguide 12. For tuning purposes, the inductance of inductors 15 and the capacitance of the piezoelectric elements 14 are considered as part of the electrical waveguide 12. Also for tuning purposes, the mechanical properties of at least the piezoelectric elements 14 are also considered in determining the properties of the mechanical waveguide 11. In fact, any non negligible mechanical effects of the coupler 13 and electrical waveguide 12 on the mechanical waveguide 11 need to be considered when determining the wave propagation properties of the mechanical waveguide 11. It is possible to substantially minimize the mechanical effects of the electrical waveguide 12 on the mechanical waveguide 11 by providing a connection which is soft and adds negligible stiffness. For instance, copper wires 16 having a small diameter, for example 100 microns, may be used to connect the piezoelectric elements to the inductors 15.

For an implementation of the embodiment shown in FIG. 1, an aluminum beam with a single-sided lamination of piezoelectric material was used. With this construction, the mechanical effects of the piezoelectric material on the mechanical waveguide are easily understood. The beam had a length of 670 mm, a width of 12.7 mm and a thickness of 2.191 mm (2 mm of aluminum, 191 μg of piezoelectric material). The piezoelectric material was etched to form a number of electrodes, and thus piezoelectric elements. Each element had a length of about 6.35 mm; the coupling length was about 370 mm. Adjacent piezoelectric segments were interconnected by inductors having an inductance of 50 mH and a resistance of 70 ohms. It was determined that maximum coupling could be obtained at a frequency of 7.8 kHz and a wavelength of 46 mm, resulting in a phase speed of 360 meters per second.

Figure 2:
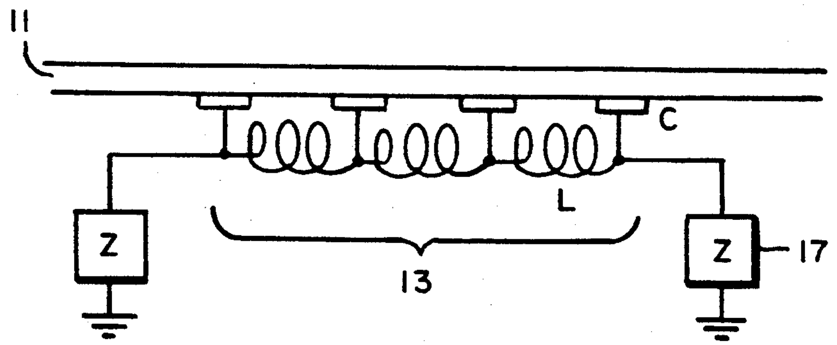
FIG. 2 is a schematic diagram of a coupler in accordance with the present invention, coupling a mechanical waveguide with an electrical impedance for dissipating mechanical energy.

One application of the system of the present invention is for damping waves traveling through structures. An illustrative embodiment is shown in FIG. 2, utilizing the coupler 13 shown in FIG. 1. The mechanical waveguide 11 may be part of a structure in which a wave travels. For example, an airplane engine may generate waves in the skin of the airplane wing. The coupler 13 converts the energy of the mechanical wave into electrical energy which is output at the end of coupler 13 into an impedance 17, such as a resistor. The impedance should provide a matched termination to eliminate reflections of the electrical wave.

Figure 3:
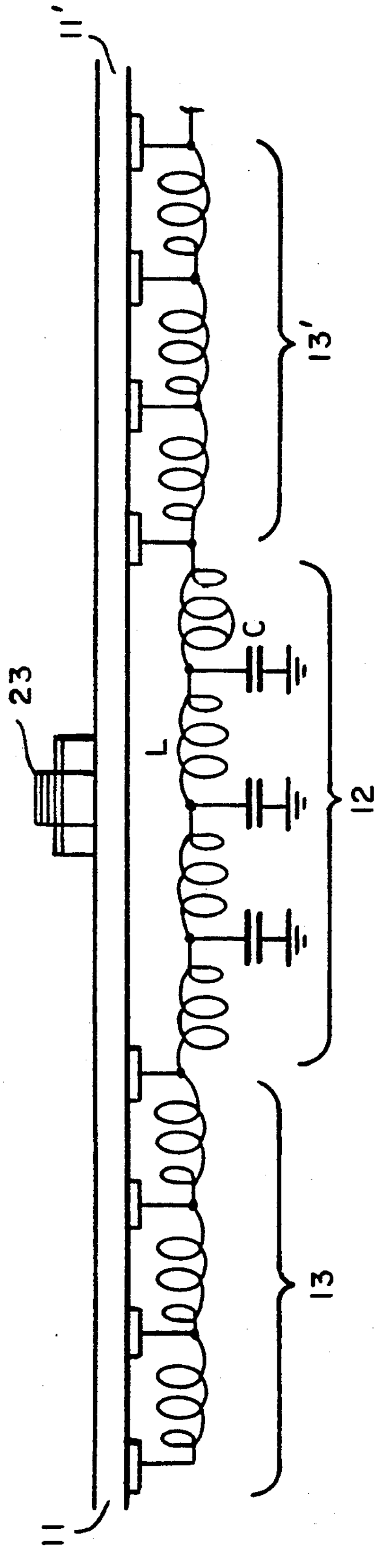
FIG. 3 is a schematic diagram of the system of FIG. 1 in combination with a second mechanical waveguide.

The energy conversion system of the present invention may also be used for transferring mechanical energy in one structure, or mechanical waveguide, to another structure, or mechanical waveguide. An illustrative embodiment of this use is shown in FIG. 3. Similar to the embodiment shown in FIG. 1, a mechanical waveguide 11 and an electrical waveguide 12 are interconnected by a coupler 13. In a similar fashion, a second mechanical waveguide 11' is connected to the electrical waveguide 12 via a second coupler 13'. It should be understood that the electrical waveguide 12 in this instance may also be a wire. Using such a system, a wave propagating through one mechanical waveguide may be transferred into a second mechanical waveguide. A particular use of this application involves isolation of mechanical structures from mechanical waves. For instance, a wave may be transferred around a structure which may cause noise or reflection, such as a point of increased stiffness, e.g. due to an attachment point, such as a bolt 23, on the structure. If a mechanical wave in a structure is completely absorbed by a coupler 13, the wave may be transferred to another part of the same structure as an electrical wave, and recoupled into the structure by another coupler 13. Portions of the structure intermediate the two couplers 13 are thus isolated from mechanical waves in the structure.

Figure 4:
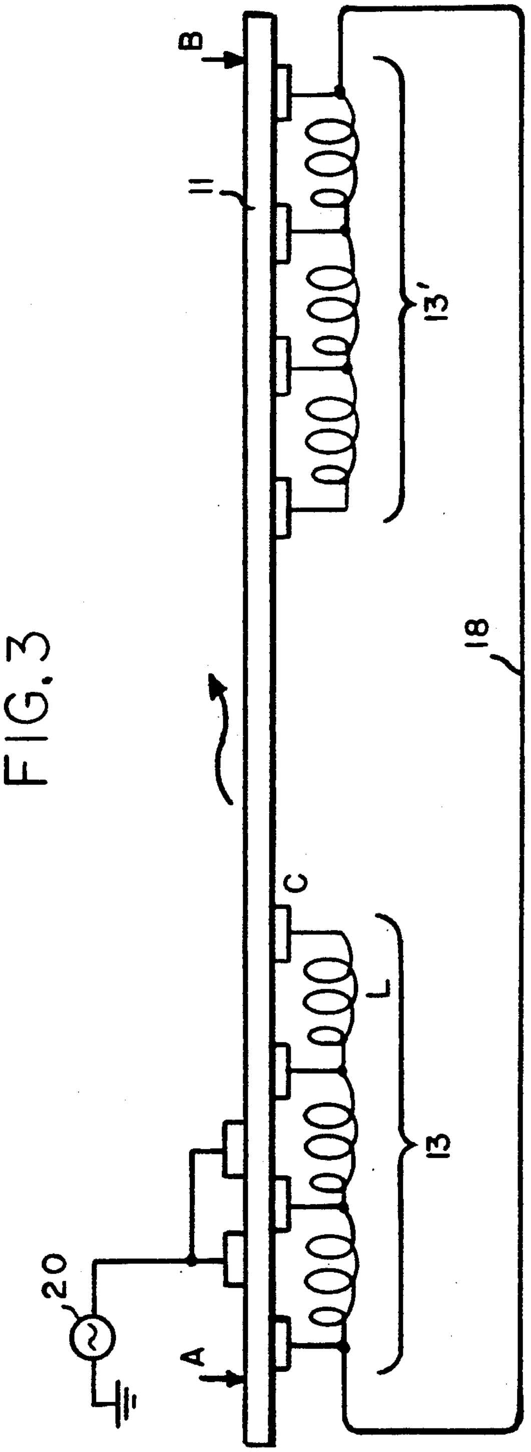
FIG. 4 is a schematic diagram of a coupler in accordance with the present invention for creating resonance in a mechanical waveguide.

Yet another application of the present invention involves using a coupler 13 to implement a linear motor, as shown in FIG. 4. Prior art linear motors normally consist of a circular or oval mechanical waveguide, and a drive mechanism which generates a mechanical wave in the waveguide. The mechanical wave is not converted into an electrical wave. The circular or oval shape provides a loop through which the mechanical wave propagates, whereby resonance is obtained when the length of the loop is an integer multiple of the wavelength of the mechanical wave.

A coupler according to the present invention may be used in combination with singular mechanical d 11 such as a beam which has two ends, and a drive 20 to create a linear motor. The drive 20 may be connected in a manner similar to the endless loop type of linear motors of the prior art. The o mechanical waveguide 11 is provided with couplers 13 and 13' at its respective ends which are tuned, along with the drive 20, to a wavelength at a selected frequency. The implementation shown in FIG. 4 is particularly suitable for bending wave lingar motors.

Assuming, in FIG. 4, that the wave in the mechanical waveguide is traveling from left to right, the coupler 13' converts the energy of the mechanical wave into electrical energy. The output of coupler 13' is coupled to the input of the second coupler 13 which is connected to the opposite end of the mechanical waveguide 11. The coupling of the two couplers may be completed simply by a wire 18, provided that resonance may be obtained. That is, the electrical wave fed back to coupler 13 and converted into a mechanical wave should dynamically reinforce the wave in the mechanical waveguide 11 produced by drive 20 (i.e., the drive signal and feedback signal are in phase). In order to obtain resonance, the effective length of the loop through which the mechanical and electrical waves propagate should be equal to an integer multiple of the wavelength of the wave being propagated. If the coupling length is optimal and the coupler is appropriately matched to the mechanical wave, the length of the loop is determined by the length of the mechanical waveguide from the beginning of the first coupler 13 to the end of the second coupler 13' as shown by, respectively, points A and B in FIG. 4, along with the effective length of any electrical waveguide between the output of the second coupler 13' and the input of the first coupler 13. The length of the electrical waveguide is equal to the ratio of the phase shift to 360° provided by the waveguide at the operating frequency. The criterion for resonance may also be understood as requiring the total phase shift through the loop to be equal to $2k\pi$, where k is an integer. A wire, such as shown in FIG. 4, has effectively a negligible length for calculating the length of this loop. If the length of the loop is not an integer multiple of the wavelength, inductors and capacitors may be added as part of the coupling 18 between the couplers 13 and 13'. For this purpose, it may be preferable to provide a tunable LC circuit which allows for compensation of the length of this loop due to variations in the operating frequency. Other options for tuning the system to achieve resonance include varying the drive frequency, and thus the wavelength, of the propagating wave, and varying the length of the mechanical waveguide by adjusting the relative positions of couplers 13 and or 13' or by other suitable means.

Modifications of and adaptations to the present invention may also include providing a tapered coupling of strength gradually increasing with length along the coupler. That is, the coupling strength of the electromechanical energy converter could be varied as a function of the position within the length of the coupler. Such a modification may be made, for example, by providing different electromechanical energy converters with different coupling strengths. By gradually increasing the coupling strength, possible negative effects of coupling, such as reflection due to the sudden change in the characteristics of the waveguide, may be reduced.

Having now described a few embodiments of the invention, it should be apparent to those skilled in the art that the foregoing is illustrative only and not limiting, having been presented by way of example only. Numerous other embodiments and modifications thereof are contemplated as falling within the scope of the present invention as defined by the appended claims and equivalents thereto.

What is claimed is:

1. A system for coupling energy between an electrical and a mechanical wave, comprising:

a mechanical waveguide for propagating a mechanical wave having a mechanical wavelength at a particular frequency; and electromechanical energy conversion means, having a coupling strength, for coupling energy between an electrical wave and said mechanical wave, said conversion means being attached to a portion of said waveguide, said portion having a length, in units of coupled wavelength, selected on the basis of the reciprocal of the coupling strength and a predetermined amount of wave energy to be coupled, and having means for propagating said electrical wave, said electrical wave having an electrical wavelength substantially equal to said mechanical wavelength at said particular frequency.

2. A system as set forth in claim 1, further comprising:

an electrical waveguide for propagating said electrical wave propagated by said conversion means.

3. A system as set forth in claim 1, further comprising:

a second mechanical waveguide for propagating a second mechanical wave having a second mechanical wavelength substantially equal to said electrical wavelength at said frequency;

a second electromechanical energy conversion means, having a coupling strength, for coupling energy between said electrical and said second mechanical wave, said second conversion means being attached to a portion of said second waveguide, said portion having a length, in units of coupled wavelength, selected according to a function of the reciprocal of the coupling strength, and having means for propagating said electrical wave; and means for communicating said electrical wave between both said conversion means.

4. A system as set forth in claim 1, further comprising:

means for receiving and dissipating said electrical wave from said conversion means.

5. A system as set forth in claim 1, wherein the mechanical waveguide has first and second ends, the conversion means being attached to said waveguide at said first end, the system further comprising:

drive means for generating said mechanical wave in said waveguide;

second electromechanical energy conversion means, having means for receiving said electrical wave and having a coupling strength, for coupling energy between said electrical wave and a second mechanical wave having a second mechanical wavelength substantially equal to said electrical wavelength, said second conversion means being attached to a portion of said waveguide at said second end, said portion having a length, in units of coupled wavelength, selected according to a function of the reciprocal of the coupling strength; and said waveguide and both said conversion means forming a loop through which electrical and mechanical waves propagate, said loop having a phase shift substantially equal to an integer multiple of $2\pi$.

6. A system as set forth in claim 1, wherein said conversion means comprises:

piezoelectric material attached to the mechanical waveguide;

a plurality of electrodes formed on said piezoelectric material having a spacing less than half the coupled wavelength; and a plurality of inductors and means for connecting said inductors between adjacent electrodes.

7. A system as set forth in claim 6, wherein said means for connecting said inductors includes means for isolating sa inductors from substantially affecting the mechanical wave in the mechanical waveguide.

8. A system as set forth in claim 6, wherein said mechanical waveguide comprises a beam and wherein said mechanical wave is a bending wave.

9. A system as set forth in claim 6 wherein the length of said portion, measured in units of coupled wavelength, is substantially equal to an odd integer multiple of the reciprocal of the coupling strength.

10. A system as set forth in claim 6, wherein the number of electrodes per wavelength is a non-integer.

11. A system as set forth in claim 3, wherein said conversion means comprises:

piezoelectric material attached to the mechanical waveguide;

a plurality of electrodes formed on said piezoelectric material having a spacing less than half the coupled wavelength; and a plurality of inductors and means for connecting said inductors between adjacent electrodes.

12. A system as set forth in claim 11, wherein said means for connecting said inductors includes means for isolating said inductors from substantially affecting the mechanical wave in the mechanical waveguide.

13. A system as set forth in claim 11 wherein the length of said portion, measured in units of coupled wavelength, is substantially equal to an odd integer multiple of the reciprocal of the coupling strength.

14. A system as set forth in claim 5, wherein said conversion means comprises:

piezoelectric material attached to the mechanical waveguide;

a plurality of electrodes formed on said piezoelectric material having a spacing less than half the coupled wavelength; and a plurality of inductors and means for connecting said inductors between adjacent electrodes.

15. A system as set forth in claim 14, wherein said means for connecting said inductors includes means for isolating said inductors from substantially affecting the mechanical wave in the mechanical waveguide.

16. A system as set forth in claim 14 wherein the length of said portion, measured in units of coupled wavelength, is substantially equal to an odd integer multiple of the reciprocal of the coupling strength.

17. A system as set forth in claim 9, further comprising:

means for receiving and dissipating said electrical wave from said conversion means.

18. A waveguide coupler for coupling energy between an electrical wave and a mechanical wave in a mechanical waveguide, the mechanical wave having a mechanical wavelength at a frequency, the electrical wave having an electrical wavelength substantially equal to the mechanical wavelength at said frequency, said coupler comprising:

a plurality of electromechanical energy converters, having a coupling strength, for coupling energy between said electrical and mechanical waves, said converters being attached to a portion of said waveguide, said portion having a length, in units of coupled wavelength, selected on the basis of the reciprocal of said coupling strength and a predetermined amount of wave energy to be coupled, and having means for propagating said electrical wave.

19. A system as set forth in claim 18 wherein the energy converters have a spacing less than half the coupled wavelength, and wherein the electromechanical energy converter comprises:

piezoelectric material attached to the mechanical waveguide;

an electrode formed on said piezoelectric material; and an inductor and means for connecting said inductor between said electrode and an adjacent electrode.

20. A system as set forth in claim 19, wherein the length of said portion, measured in units of coupled wavelength, is substantially equal to an odd integer multiple of the reciprocal of the coupling strength.

21. A system as set forth in claim 19, wherein the length of said portion, measured in units of coupled wavelength, is substantially equal to an odd integer multiple of the reciprocal of the coupling strength.

22. A system as set forth in claim 18, wherein the length of said portion, measured in units of coupled wavelength, is substantially equal to an odd integer multiple of the reciprocal of the coupling strength.

23. A system for damping mechanical waves propagating in a mechanical waveguide, having a mechanical wavelength at a particular frequency, the system comprising:

electromechanical energy conversion means, having a coupling strength, for coupling energy from the mechanical wave to an electrical wave, said conversion means being attached to a portion of the mechanical waveguide, said portion having a length, in units of coupled wavelength, selected on the basis of the reciprocal of the coupling strength in a predetermined amount of wave energy to be coupled, and having means for propagating said electrical wave, said electrical wave having an electrical wavelength substantially equal to said mechanical wavelength as of the said particular frequency; and means for receiving and dissipating said electrical wave from said conversion means.

24. The system of claim 23 wherein the mechanical waveguide is a mechanical structure in an aircraft.

* * * * *

UNITED STATES PATENT AND TRADEMARK OFFICE

CERTIFICATE OF CORRECTION

PATENT NO. : 5,220,296

DATED : June 15, 1993

INVENTOR(S) : Andreas von Flotow, Nesbitt Hagood and Tomas Valis

It is certified that error appears in the above-indentified patent and that said Letters Patent is hereby corrected as shown below:

On page 1, line 5, as the first paragraph following the "Field of the Invention", insert: --This invnetion was made with government support under contract Number N00014-88-K-0669 awarded by the Navy. The government has certain rights in the invention.--.

Signed and Sealed this

Twenty-fifth Day of January, 1994

Attest:

BRUCE LEHMAN

*Attesting Officer* *Commissioner of Patents and Trademarks*